(12) United States Patent
Saka et al.

(10) Patent No.: US 6,851,956 B2
(45) Date of Patent: Feb. 8, 2005

(54) ELECTRICAL CONNECTOR BOX

(75) Inventors: Yuuji Saka, Yokkaichi (JP); Takeharu Ito, Yokkaichi (JP)

(73) Assignee: Sumitomo Wiring Systems Ltd., Yokkaichi (JP)

( * ) Notice: Subject to any disclaimer, the term of this patent is extended or adjusted under 35 U.S.C. 154(b) by 0 days.

(21) Appl. No.: 10/378,625

(22) Filed: Mar. 5, 2003

(65) Prior Publication Data

US 2003/0176116 A1 Sep. 18, 2003

(30) Foreign Application Priority Data

Mar. 12, 2002 (JP) .......................................... 2002-066442

(51) Int. Cl.$^7$ .............................................. H01R 12/00
(52) U.S. Cl. ....................... 439/76.2; 439/874; 439/949
(58) Field of Search ................................ 439/76.2, 874, 439/875, 949, 709

(56) References Cited

U.S. PATENT DOCUMENTS

| | | | | |
|---|---|---|---|---|
| 2,794,176 A | * | 5/1957 | Barnes ........................ | 439/874 |
| 4,252,397 A | * | 2/1981 | Eigenbrode et al. ........ | 439/405 |
| 4,692,121 A | * | 9/1987 | Arbogast, Jr. ............... | 439/874 |
| 4,920,642 A | * | 5/1990 | Yanai et al. .................. | 29/860 |
| 4,926,548 A | * | 5/1990 | Hopkins et al. ............. | 439/874 |
| 5,295,842 A | * | 3/1994 | Ozaki et al. ................. | 439/76.2 |
| 5,541,365 A | * | 7/1996 | Sugiura et al. .............. | 439/874 |
| 5,707,243 A | * | 1/1998 | Endo et al. .................. | 439/76.2 |
| 5,718,598 A | * | 2/1998 | Saka et al. ................... | 439/949 |
| 5,797,763 A | * | 8/1998 | Saka et al. ................... | 439/949 |
| 6,126,457 A | * | 10/2000 | Smith et al. ................. | 439/76.2 |

FOREIGN PATENT DOCUMENTS

JP          6-197432          7/1994

OTHER PUBLICATIONS

English Language Abstract of JP Appln. No. 6–197432.

* cited by examiner

Primary Examiner—Tho D. Ta
(74) Attorney, Agent, or Firm—Greenblum & Bernstein, P.L.C.

(57) ABSTRACT

An electrical connector box includes a connector box case configured to guide a wire along a side of the case, a relay terminal having pinch blades on one end thereof, the pinch blades having a slot therebetween and configured to hold the wire in the slot. The connector box also includes one of a female and male connector on the other end of the relay terminal, the one of a female and male connector configured to connect to a terminal of at least a relay, a fuse and a connector. The slot is configured to be welded closed, or the pinch blades are configured to weldingly secure the wire thereto.

20 Claims, 15 Drawing Sheets

PRIOR ART

FIG. 9A

PRIOR ART

FIG. 9B

ELECTRICAL CONNECTOR BOX

FIELD OF THE INVENTION

The present invention relates to an electrical connector box to which branch wires of an automotive wiring harness are connected, and more particularly, to an electrical connector box in which the wires connecting internal circuits do not extend downward from the connector box in loop configurations.

DESCRIPTION OF THE RELATED ART

Figure 9A:
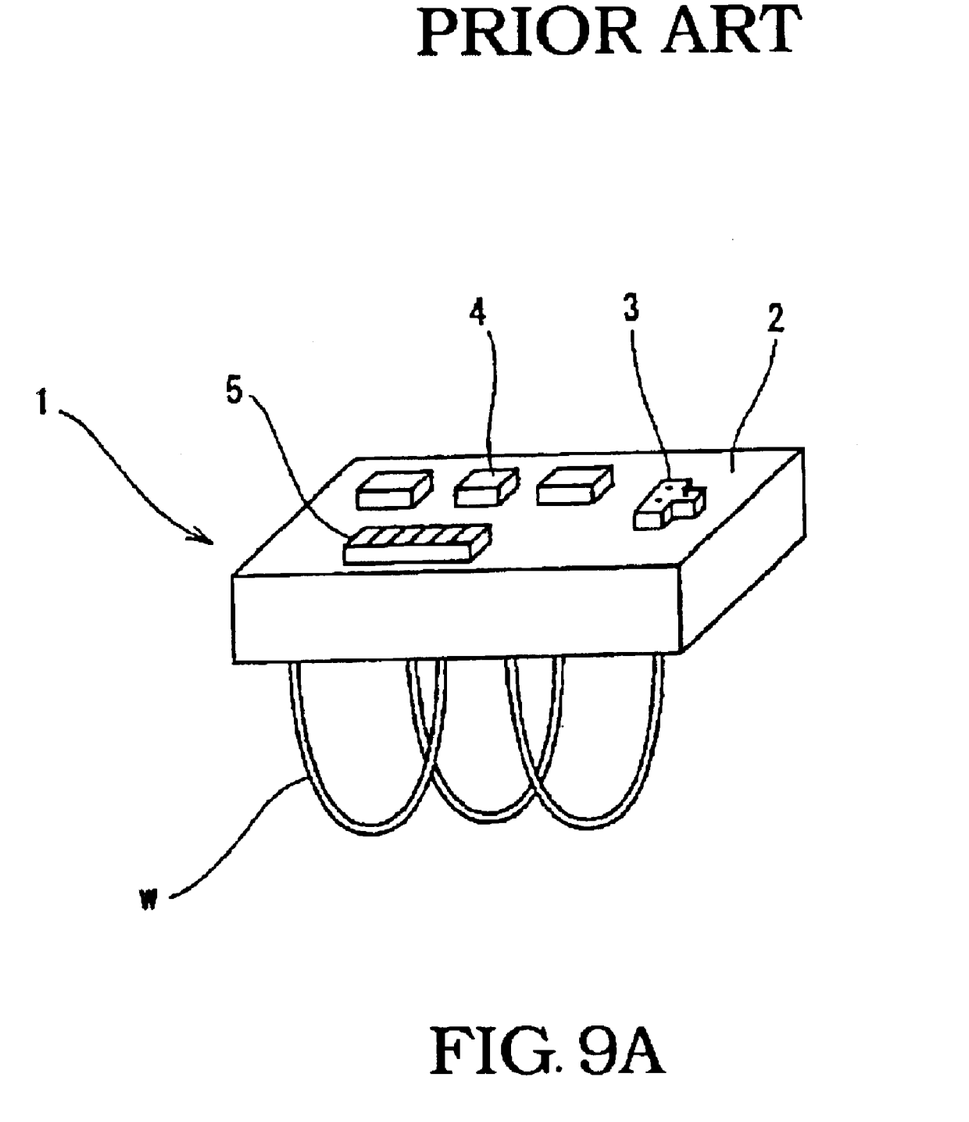
FIG. 9A is a perspective view showing a related art electrical connector box.

As illustrated in FIG. 9A, a conventional electrical connector box of the type to which the branch wires of an automotive wiring harness are attached, incorporates relay receptacles 3, connector receptacles 4, and fuse receptacles 5, all of which are located on the upper side of case 2. The connections of the internal circuits of electrical connector box 1 are formed through vertical busbars (not shown in the figure) and wires 'w'.

In the known connector box, all of the circuits within electrical connector box 1 are configured in a way that would allow their connection through a vertical busbar, but the density of the various components installed within the limited space of case 2 in electrical connector box 1 makes this type of structure difficult to attain. Therefore, power distribution circuits that carry a large current flow are structured to include a vertical busbar, and other circuits are structured so as to include wires 'w'.

Figure 9B:
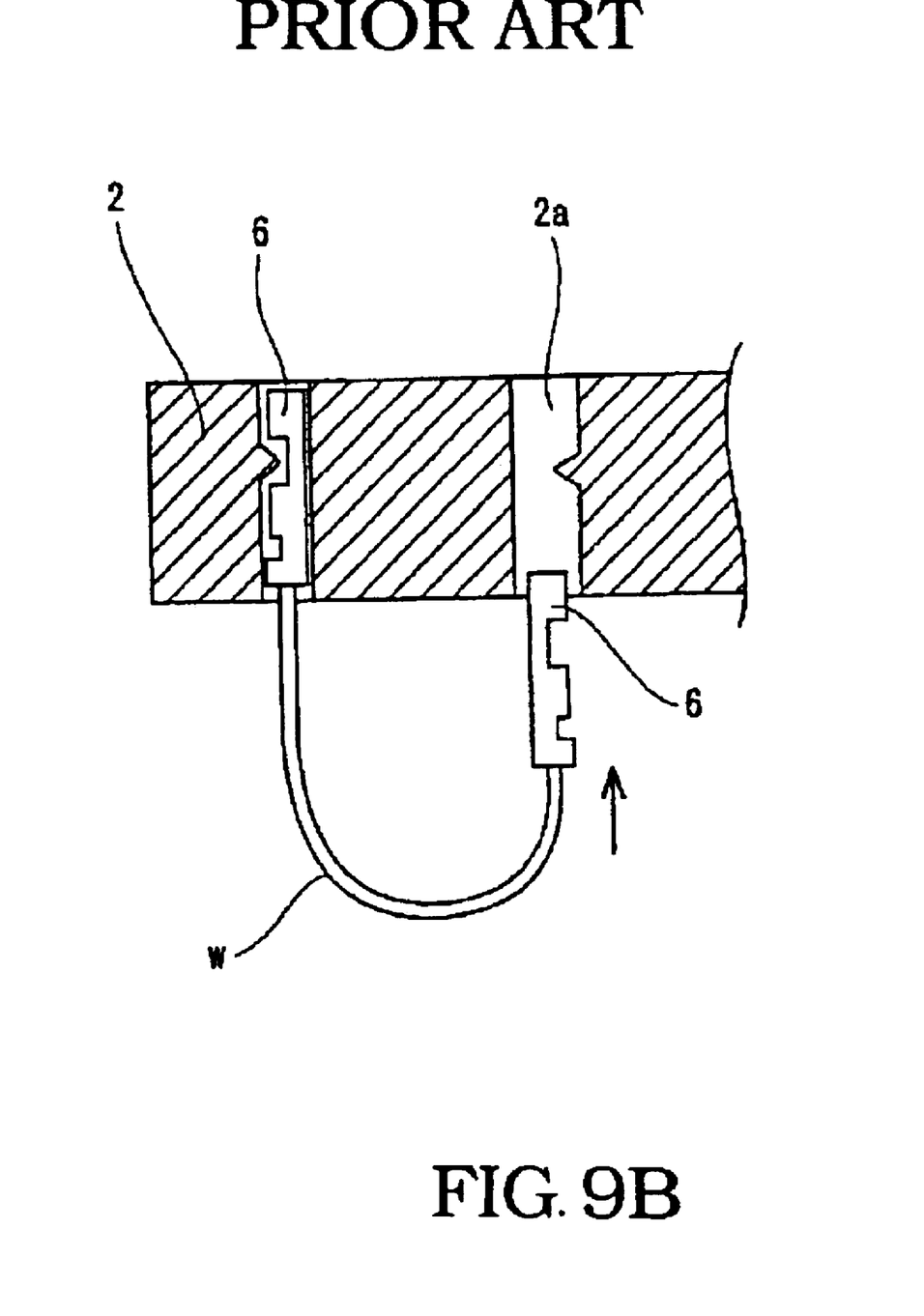
FIG. 9B is a partial side sectional view of the related art connector box.

As illustrated in FIG. 9B, in a case where wire 'w' is used to connect the internal circuits of electrical connector box 1, wire 'w' must be of sufficient length to allow the insertion of friction terminals 6, which are attached to both ends of wire 'w', upward into terminal receptacles 2a from the floor of case 2. After terminals 6 are completely inserted into receptacles 2a, wire 'w' assumes a loop shape that hangs downward from case 2.

The downward extending loop formed by wire 'w' hanging from the bottom of electrical connector box 1 poses a problem in that it can snag on other components during shipment and also when the connector box is installed to the vehicle, thus resulting in reduced assembly efficiency and the possibility of damage to the wires and connector box, a factor that can adversely affect the quality of the connector box.

SUMMARY OF THE INVENTION

The present invention, having taken the aforesaid problems into consideration, provides an improved structure for an electrical connector box in which wires do not extend downward from the connector box, thus improving both assembly efficiency and the quality of the connector box.

The present invention provides an electrical connector box having at least one of a relay, a fuse and a connector. The connector box has a connector box case configured to guide a wire along a side of the case, a relay terminal having pinch blades on one end thereof, the pinch blades having a slot therebetween and configured to hold the wire in the slot. Also provided is one of a female and male connector on the other end of the relay terminal, the one of a female and male connector configured to connect to a terminal of the at least one of a relay, a fuse and a connector. The slot may be configured to be welded closed, or the pinch blades may be configured to weldingly secure the wire thereto. Further, the side of the case may be an underside.

In one aspect of the invention, the electrical connector box may be a relay block, and the case may include a plurality of wire guides on the side of the case, the plurality of wire guides configured to guide the wire along the side of the case. Each end of the wire may be respectively connected to pinch blades of respective relay terminals. The other end of the relay terminal may be a female terminal or a male terminal configured to join the terminal of the at least one a relay, a fuse and a connector.

In another aspect of the invention, a busbar configured to conduct a first electrical current may be provided, wherein the wire is configured to conduct a second electrical current weaker than the first electrical current.

In a further aspect of the invention, the case may further include a holding cavity configured to selectively hold one of the relay terminal and a terminal connected to a wire end.

The present invention also provides a method for routing an electrical wire along a surface of an electrical connector box. The method includes holding the wire in a slot located between pinch blades on an end of a relay terminal, connecting one of a female and male terminal provided on the other end of the relay terminal to a terminal of at least one of a relay, a fuse and a connector, and welding the slot closed.

In another aspect of the invention, the method may include guiding the wire along the electrical connector box via a plurality of wire guides on the electrical connector box, wherein the electrical connector box is a relay block, and the connecting includes connecting a female terminal of the relay terminal to the terminal of the at least one of a relay, a fuse and a connector.

In a further aspect of the invention, the method may include conducting a first electrical current through a busbar, and conducting a second electrical current weaker than the first electrical current, through the wire.

An additional aspect of the invention may include selectively holding, in a holding cavity, one of the relay terminal and a terminal crimped to a wire end.

The present invention also provides a method for routing an electrical wire along a surface of an electrical connector box. The method includes holding the wire in a slot located between pinch blades on an end of a relay terminal, connecting one of a female and male terminal provided on the other other end of the relay terminal to the terminal of the at least one of a relay, a fuse and a connector, and welding the wire to the pinch blades.

Still yet another aspect of the invention may include guiding the wire along the electrical connector box via a plurality of wire guides on the electrical connector box, wherein the electrical connector box is a relay block, and the connecting includes connecting a female terminal of the relay terminal to the terminal of the at least one of a relay, a fuse and a connector.

Another aspect of the invention may include conducting a first electrical current through a busbar, and conducting a second electrical current weaker than the first electrical current, through the wire.

An aspect may still yet include selectively holding, in a holding cavity, one of the relay terminal and a terminal connected to a wire end.

The present invention provides a structure for an electrical connector box in which electrical wires run along the underside of the connector box case, each of the wires being forcibly inserted between pinch blades formed on one end of a relay terminal after which the slot between the tips of the pinch blades is welded closed, or after which the wire held between the pinch blades is welded to the pinch blades. Female or male connector terminals are formed on the other ends of the aforesaid relay terminals opposite to the aforesaid pinch blades, and the aforesaid female or male connector terminals are joined to the terminals of relays, fuses, and/or connectors installed to the electrical connector box.

The aforesaid connector box structure runs electrical wires along the underside of the connector box case and therefore prevents the wires from hanging downward outside of the case, thus eliminating the problem of the downwardly hanging electrical wires inadvertently snagging on objects during shipment or when the connector box is installed to a vehicle, and thus improving both installation efficiency and the quality of the electrical connector box.

The connections between the electrical wires and the male or female relay terminals that connect to relays and other electrical components are not only maintained by the pressure applied against the electrical wire by the pinch blades, but also by a weld that connects the slot between the ends of the pinch blades, or a weld that connects the wire to the pinch blades. As a result, the reliability of the connection between the wire and pinch blades is improved, and the need to install a cover over the connection is eliminated. Furthermore, the elimination of the aforesaid connection cover and downwardly hanging wires makes it possible to reduce the height of the electrical connector box.

The electrical connector box of the present invention incorporates a relay block with wire guides formed on the underside thereof as means of establishing the routing path of the aforesaid electrical wires. The ends of each electrical wire are forcibly inserted between the pinch blades of a relay terminal, and the opposite end of the relay terminal is formed as a female terminal that connects to the female terminals of relays, fuses, and/or connectors located in the relay block.

By positioning the wires along the underside of the relay block through wire guides, the aforesaid connector box structure simplifies the wire installation process and eliminates the problem of wires falling out because the wires are securely held in position after their installation to the wire guides.

A vertical busbar is provided within the relay block to carry large current flows, and the aforesaid electrical wires are provided to carry medium or light current flows. In other words, a circuit that carries a large current flow, such as a power distribution circuit, is structured to include a vertical busbar, and a circuit carrying a lesser amount of current is structured to include the electrical wires that run along the underside of the case.

Relay terminal holding cavities are provided within the aforesaid relay block and are formed to a shape also able to hold a terminal crimped to a wire end. The aforesaid holding cavities are thus able to house either a relay terminal or a crimp-type wire terminal.

The invention provides terminal holding cavities shaped to accept either a relay terminal connected to a wire that runs along the underside of the relay block case, or a terminal to which an external wire has been connected through a crimped joint, therefore providing a relay block case that allows one type of relay block to be wired in various configurations without the need to utilize a differently structured relay block.

The electrical connector box positions electric wires along the surface of the connector case to prevent wires from hanging downward into the region external to the case, thus preventing the connector box wires from snagging on other components during shipment or when being installed, and thus improving the quality of the connector box as well as the efficiency with which the connector box can be handled. Moreover, as the pinch blades of the relay terminals securely grip the electrical wires, and as the tips of the pinch blades are welded together, or the wire end is welded to the pinch blades, a more reliable electrical connection is established that eliminates the need for a protective cover to be placed over the connection. Furthermore, the need for a cover over the connector box is eliminated as there are no electric wires hanging downward from the connector box, thus allowing the connector box to have a lower profile (i.e., the box may be made thinner).

Furthermore, the provision of wire guides on the underside of the case, along which the wires are routed, allows for a convenient wire installation operation. Also, the problem of disconnected wires is eliminated because the wires are positioned on and secured to the case underside upon their installation thereto. Still further, the relay terminal cavities, to which are inserted relay terminals that connect to wires running along the underside of the case, are structured to also allow the insertion of terminals that are crimped to external wires, a configuration that allows the case to be adapted to various circuit structures without the need to use a different type of case.

Other exemplary embodiments and advantages of the present invention may be ascertained by reviewing the present disclosure and the accompanying drawings.

BRIEF DESCRIPTION OF THE DRAWINGS

The present invention is further described in the detailed description which follows, in reference to the noted plurality of drawings by way of non-limiting examples of certain embodiments of the present invention, in which like numerals represent like elements throughout the several views of the drawings, and wherein.

DETAILED DESCRIPTION OF THE PREFERRED EMBODIMENTS

The particulars shown herein are by way of example and for purposes of illustrative discussion of the embodiments of the present invention only and are presented in the cause of providing what is believed to be the most useful and readily understood description of the principles and conceptual aspects of the present invention. In this regard, no attempt is made to show structural details of the present invention in more detail than is necessary for the fundamental understanding of the present invention, the description taken with the drawings making apparent to those skilled in the art how the several forms of the present invention may be embodied in practice.

Figure 1:
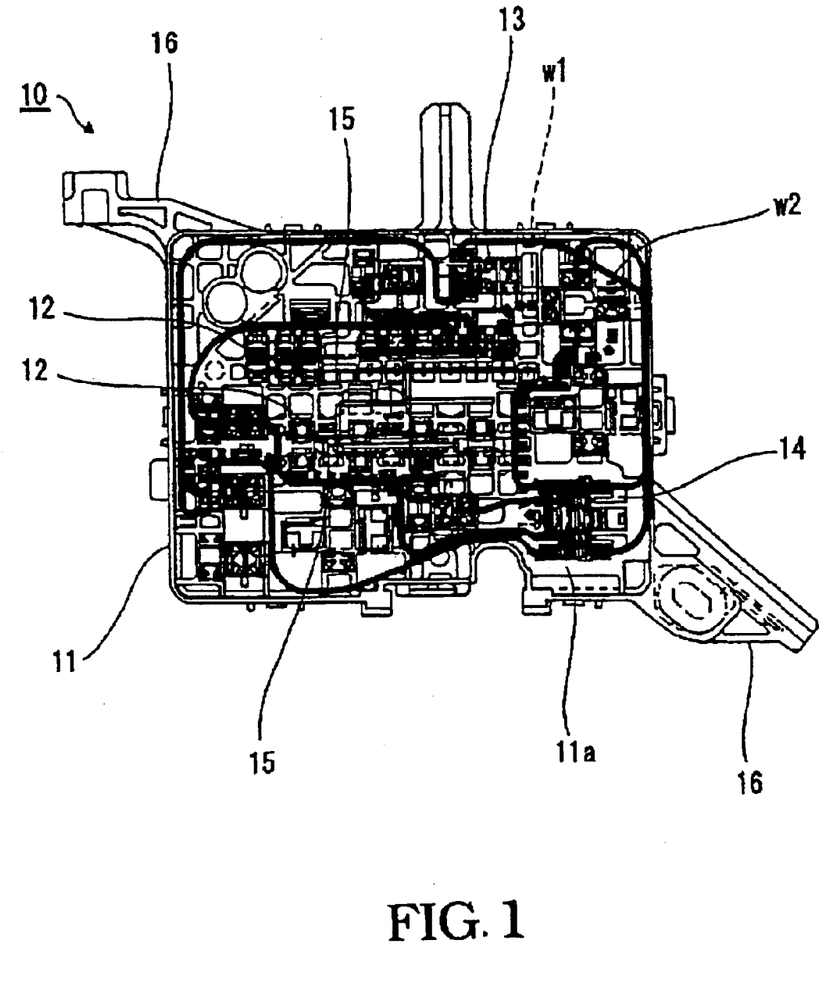
FIG. 1 is a bottom plan view of the present invention.

Referring to the drawings wherein like characters represent like elements, the present invention incorporates relay block 10, the underside thereof being illustrated in FIG. 1. Relay block 10 is equipped with fuse receptacles 12, relay receptacles 13, and connector receptacles 14. The power distribution circuit that carries a large current flow incorporates vertical busbar 15 which is inserted at a specific location on underside 11a of case 11, and the circuits that carry a lesser current flow incorporate wires w1 and w2 that run along floor 11a of case 11.

Figure 2A:
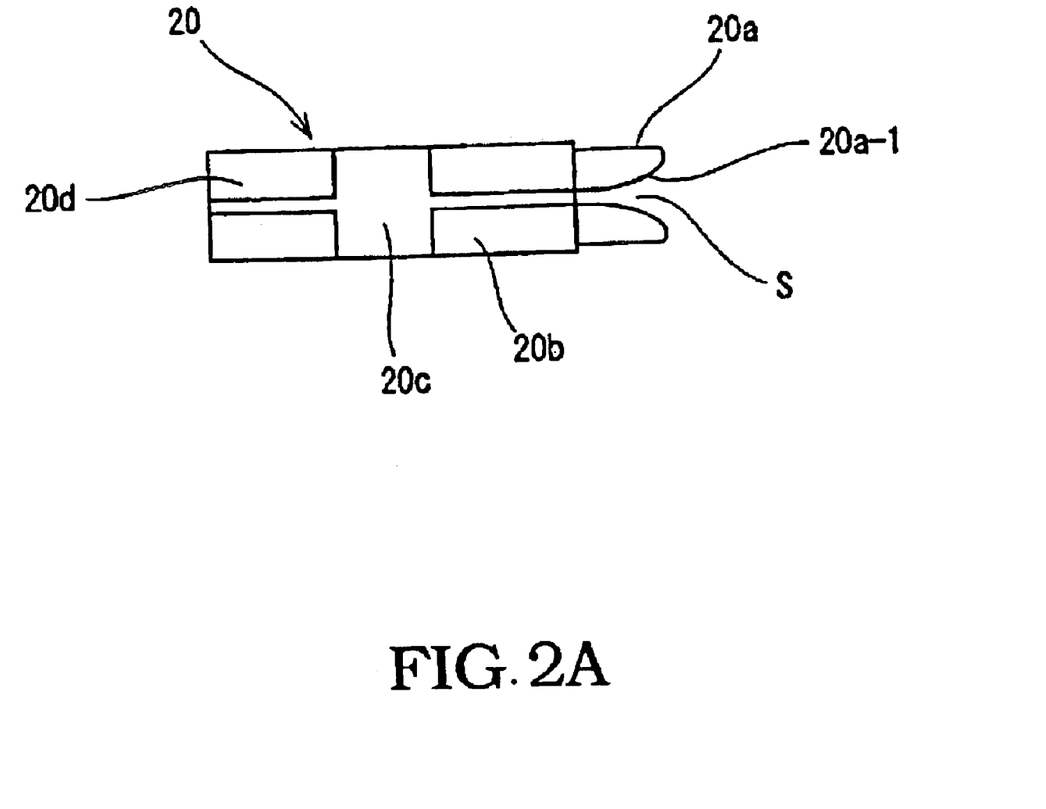
FIG. 2A is a top plan view of a relay terminal incorporating a female connector according to the present invention.
Figure 2B:
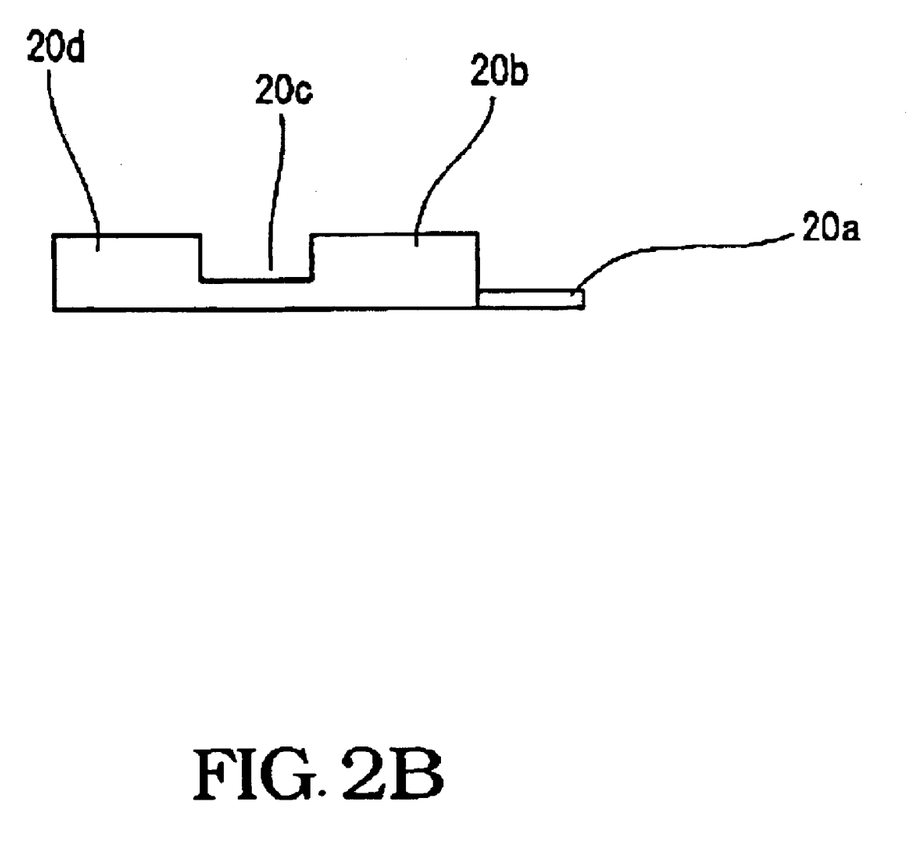
FIG. 2B is a side view of the relay terminal incorporating the female connector.
Figure 2C:
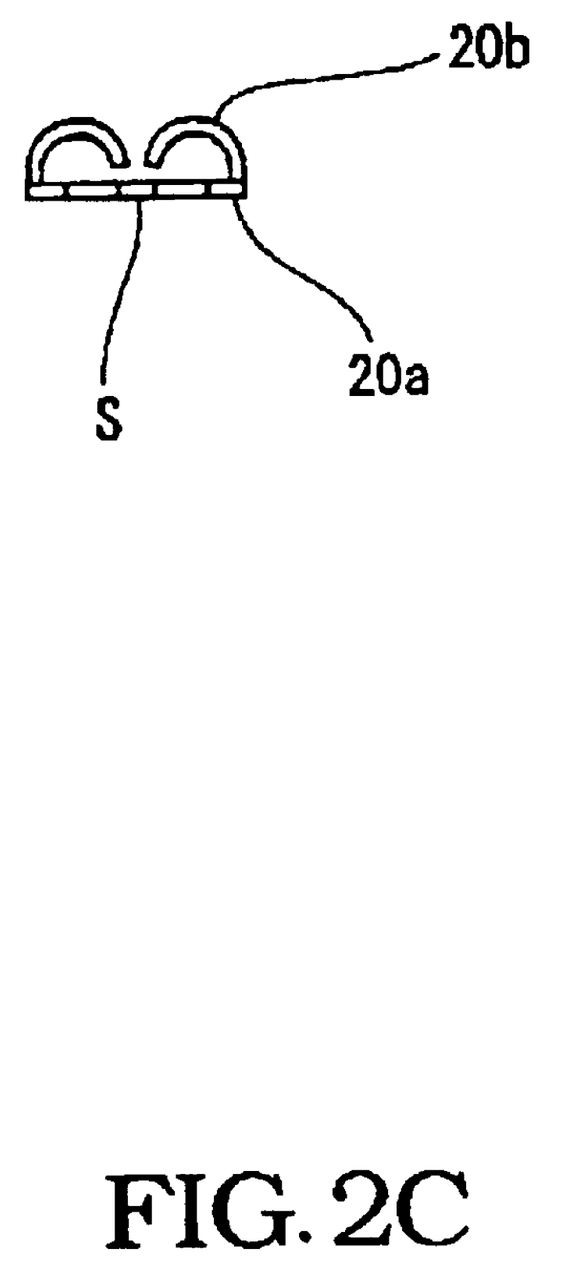
FIG. 2C is an end view of the relay terminal incorporating the female connector.

Relay terminals 20, 40 are attached to the extremities of wires w1 and w2, and are inserted and secured within cavities 18 and 18' of case 11. As shown in FIGS. 2A, 2B and 2C, a pair of pinch blades 20a incorporating tapered tip parts 20a-1 form slot S at one extremity of relay terminal 20. Female terminal 20d is formed on the other extremity of relay terminal 20. Stop notch 20c is provided between cylindrical part 20b, which is formed adjacent to pinch blades 20a and female terminal 20d.

Figure 3A:
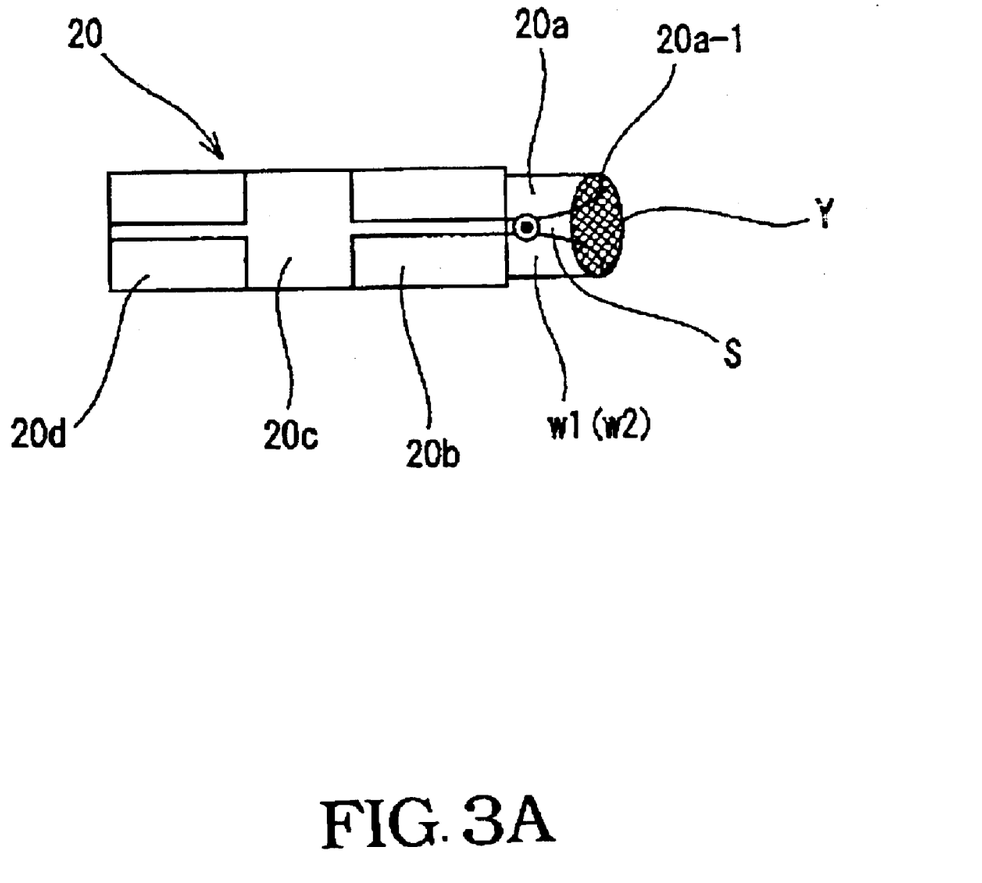
FIG. 3A is a top plan view showing a connection between the relay terminal and the wire.

As illustrated in FIG. 3A, wires w1 and w2 are connected to terminal 20 by forcibly inserting their ends into slot S between pinch blades 20a, thereby forcing pinch blades 20a to cut through the insulation of wire w1 and w2 to make electrical contact with the core conductor of the wire. The tapered ends of pinch blades 20a allow for the easy insertion of the wire without the need for excessive force.

Figure 3B:
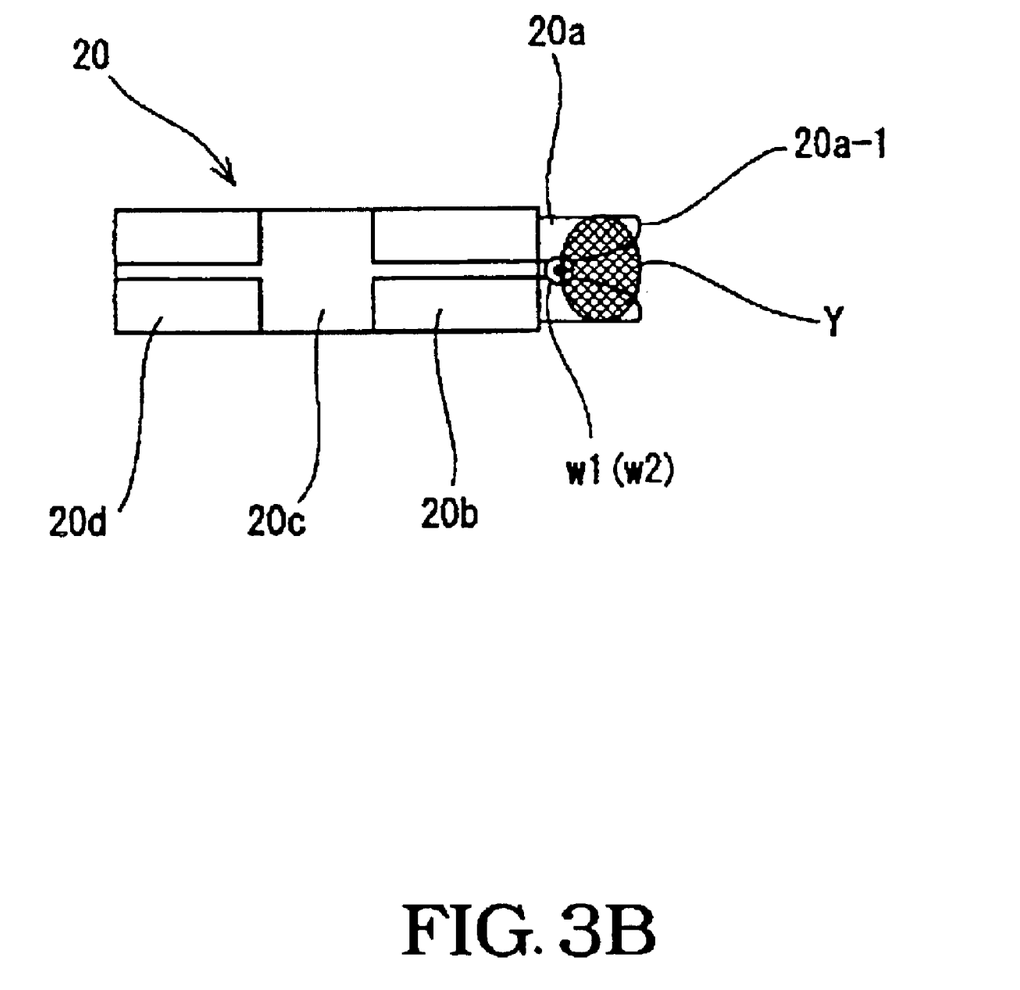
FIG. 3B is a top plan view showing a second embodiment of a connection between the relay terminal and the wire.

Once wires w1 and w2 are inserted, tapered tips 20a-1 of pinch blade 20a are connected through a gas welding process that forms welded part Y which closes slot S. FIG. 3B illustrates another type of connection in which wire w1 or w2 is welded to pinch blades 20a. It is readily understood by those skilled in the art that welding processes other then gas welding, such as ultrasonic welding, electrical resistance welding, and the like may also be used.

Figure 4A:
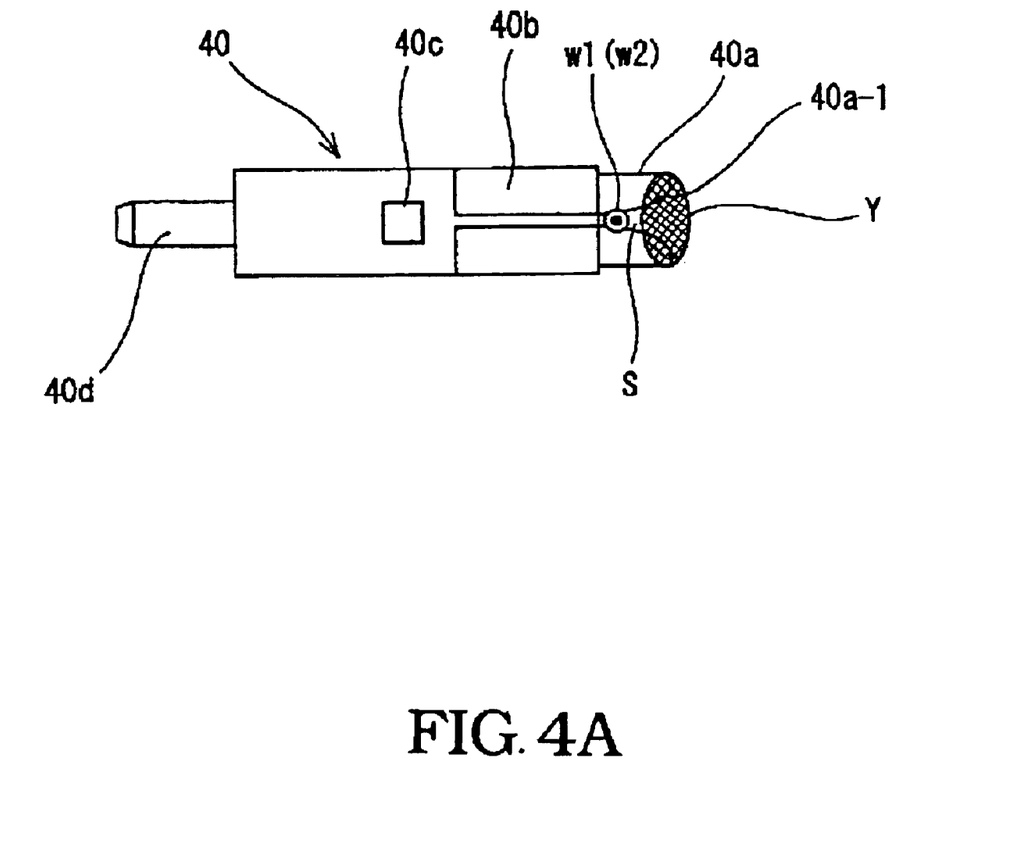
FIG. 4A is a top plan view of a relay terminal having a male terminal end.
Figure 4B:
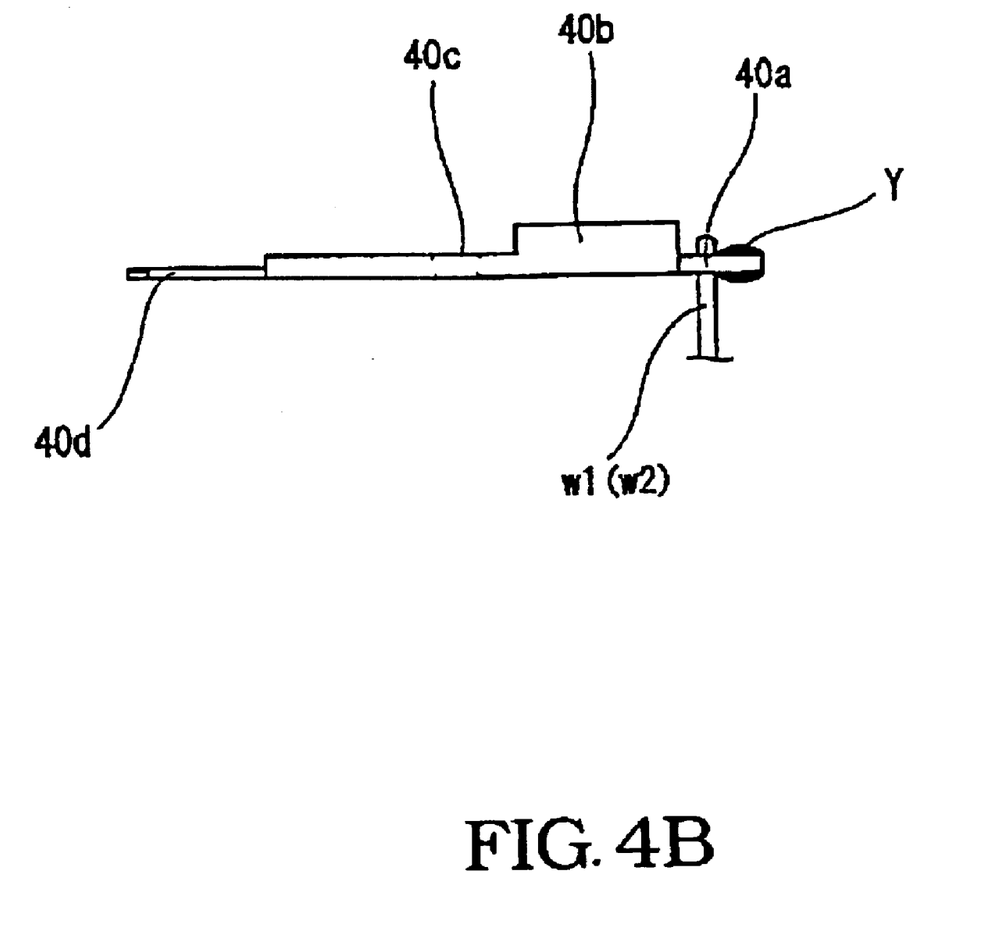
FIG. 4B is a side view that of the relay terminal of FIG. 4A.

Furthermore, as shown in FIGS. 4A and 4B, a pair of pinch blades 40a incorporating tapered tip parts 40a-1 form slot S on one end of relay terminal 40. A spade-type male terminal 40d is formed on the other extremity of relay terminal 40. Stop notch 40c is formed between cylindrical part 40b, which is formed adjacent to pinch blades 40a, and male terminal 40d. Because wire w1 and w2 are connected to relay terminal 40 in the same manner as previously described in relation to terminal 20, a description of their connecting procedure is omitted herein.

Figure 5:
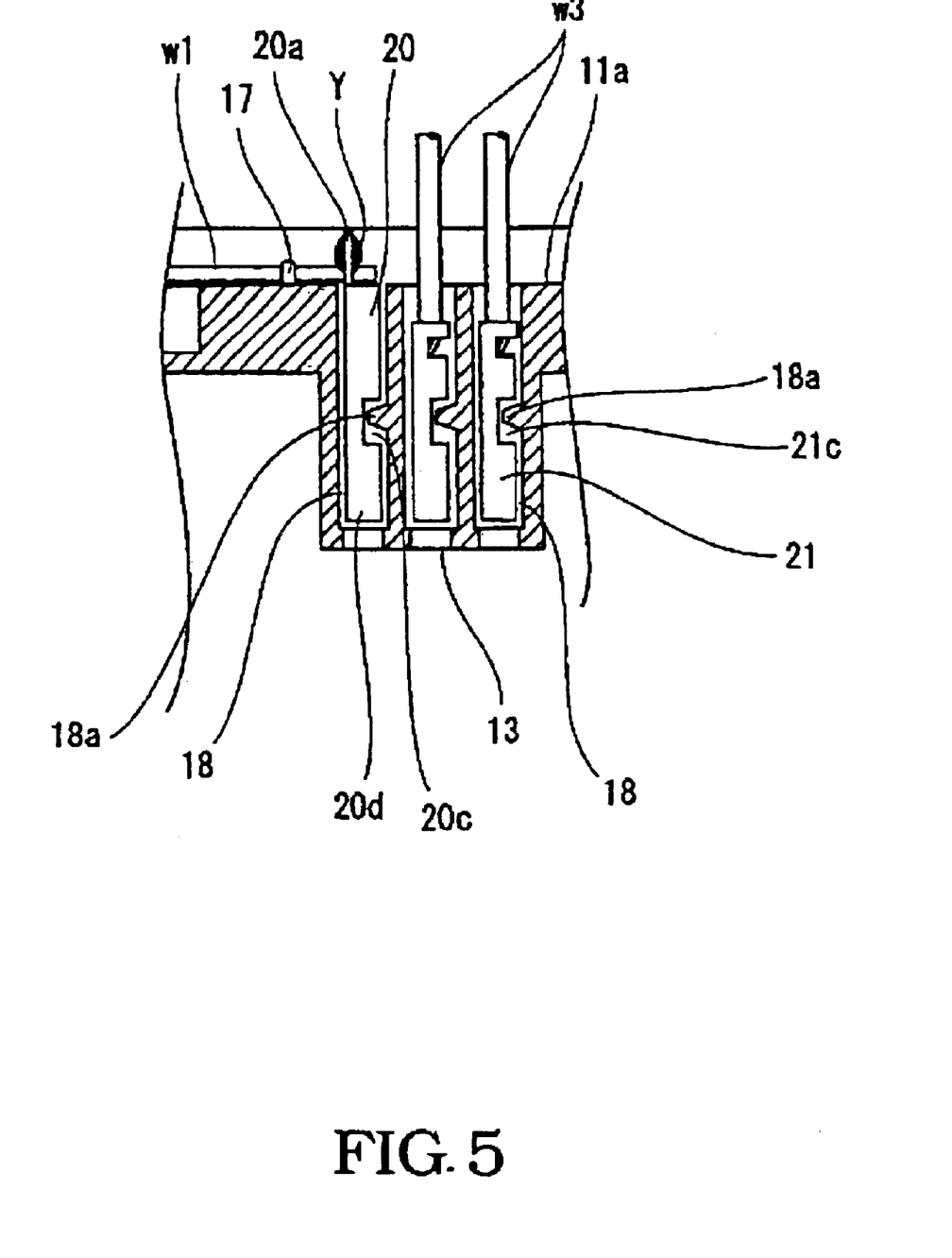
FIG. 5 is a cross section of the part of the relay block pertaining to the invention.

As illustrated in FIG. 5, relay terminal 20, which is connected to the ends of wire w1 and w2, is inserted into cavity 18 through case underside 11a, and secured within cavity 18 as a result of stop tab 18a located within stop notch 20c of the relay terminal 20. Multiple pairs of pins 17 protrude outward at specific locations from case underside 11a to form a wire guide path that guides wires w1 and w2, to which relay terminals 20 are attached, along case underside 11a.

Terminals 21, which are crimped to the ends of external wires w3 which in turn are part of an external wiring harness, are inserted into the remaining cavities 18 and secured therein by stop tab 18a located within stop notch 21c of crimped terminal 21. Each cavity 18 is configured to allow either the inserted attachment of relay terminal 20 or terminal 21 to which external wires w3 are crimped. Furthermore, as the extremity of relay terminal 20 is formed as a female-type connector, it is inserted into each of cavities 18 which form relay receptacle 13 (or fuse receptacle 12).

Figure 6:
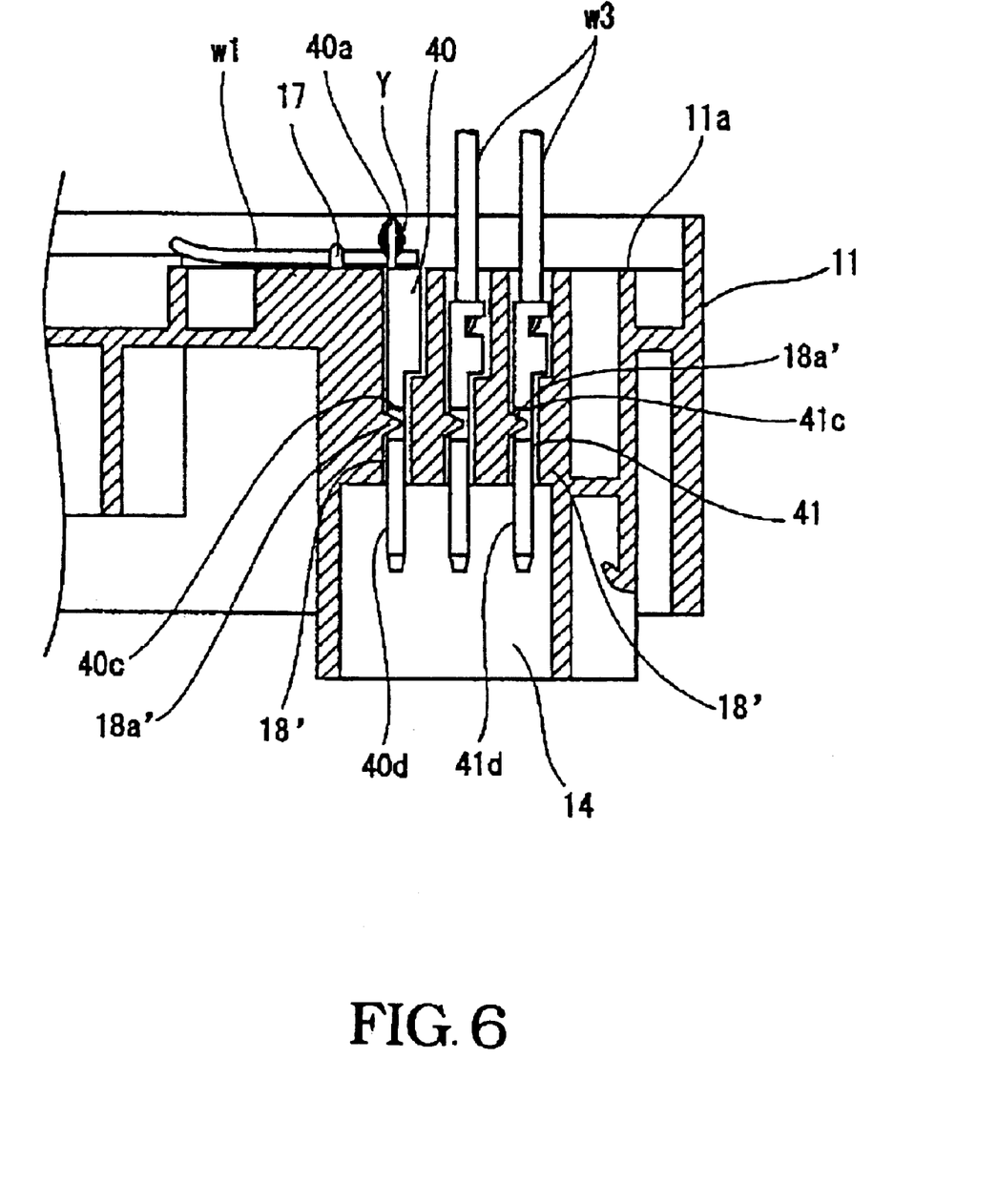
FIG. 6 is a partial side sectional view of the relay block of the present invention.

As illustrated in FIG. 6, relay terminal 40, which is connected to the ends of wire w1 and w2, is inserted through case underside 11a into cavity 18' within which stop tab 18a' is formed on an internal surface, and is secured within cavity 18' through stop tab 18a' located within stop notch 40c formed within relay terminal 40. Terminals 41, which are crimped to the ends of wires coming in from an external wiring harness, can be inserted into the remaining cavities 18' with male connector terminals 41d protruding into connector receptacle 14, and secured therein by stop tab 18a' located within stop notch 41c of terminal 41. In other words, each cavity 18' is configured to allow either the inserted attachment of relay terminal 40 or terminal 41 which is crimped to external wire w3.

Figure 7A:
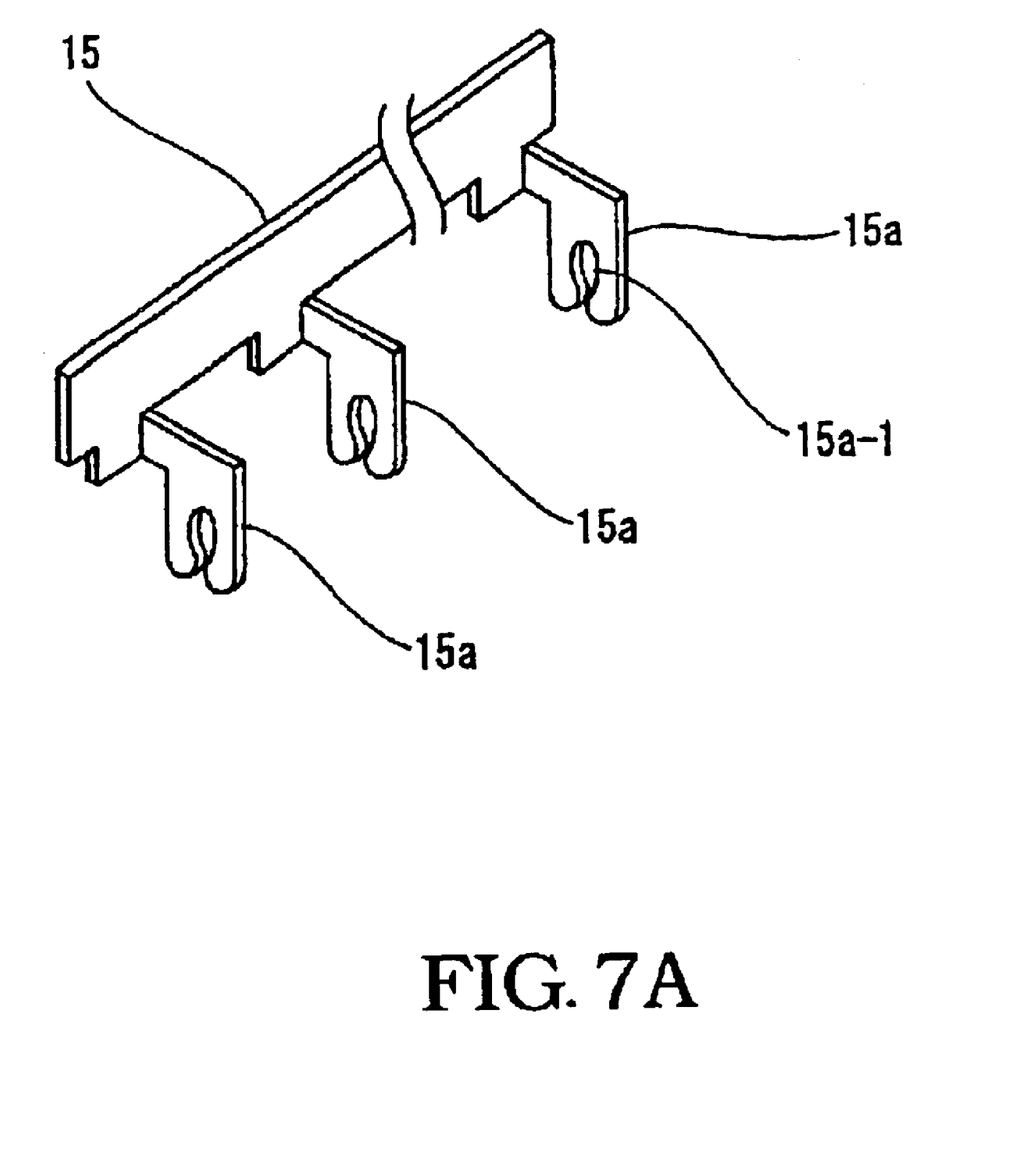
FIG. 7A is a perspective view showing a vertical busbar of the present invention.

Moreover, as illustrated in FIG. 1, the electrical power distribution circuit does not make use of electrical wire connections, but rather utilizes busbar 15 to make circuit connections. As illustrated in FIG. 7A, busbar 15 includes contact tabs 15a located at uniform intervals on the busbar with each contact tab 15a incorporating a grip slot 15a-1. Busbar 15 is inserted through case underside 11a into a parallel circuit fuse receptacle 12 into which contact tabs 15a extend to make contact with the terminals of the fuses (fuses not shown). Furthermore, the vertical busbar 15 is not only used to form the circuits that extend into the fuse receptacle 12, but also for the high current flow power distribution circuit of relay receptacle 13 and connector receptacles.

Figure 7B:
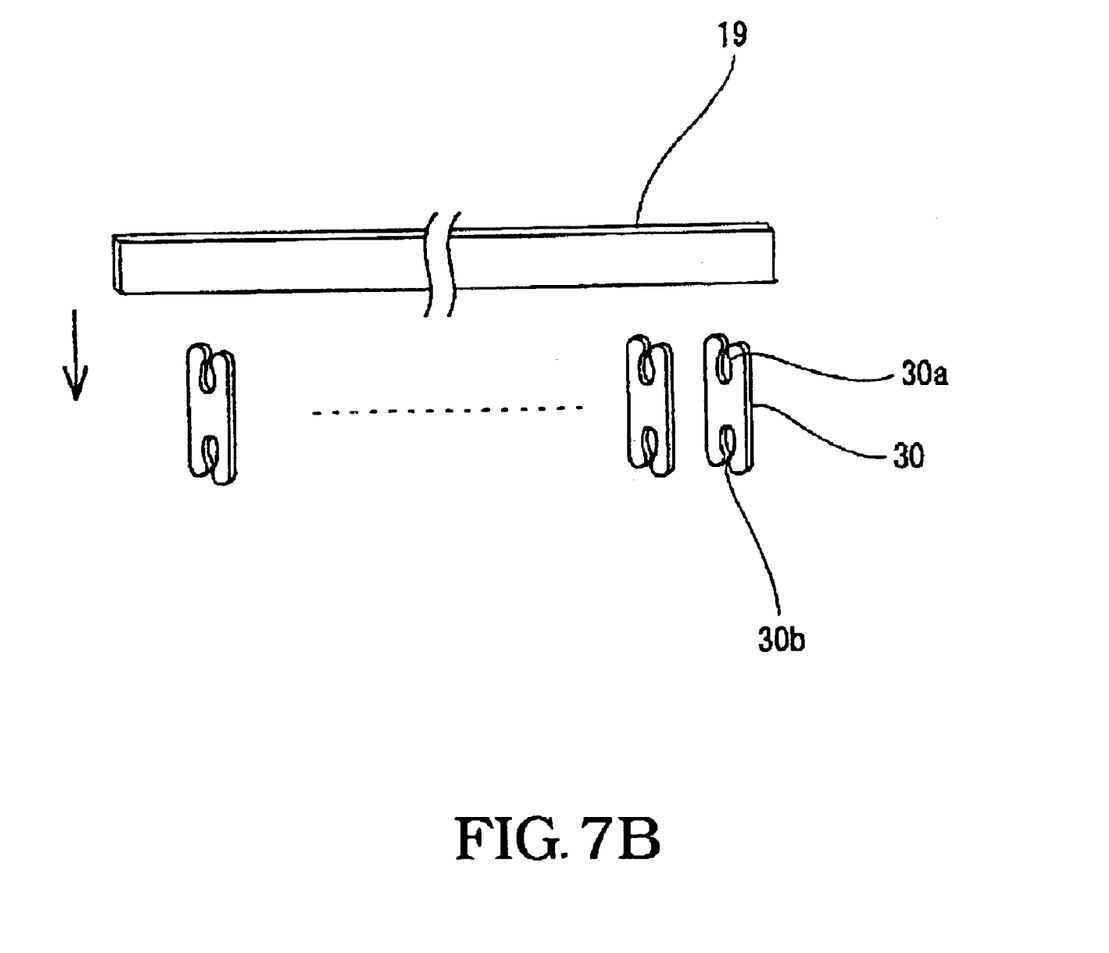
FIG. 7B is a perspective that showing a second embodiment of the vertical busbar and connecting terminal pieces of the present invention
Figure 8:
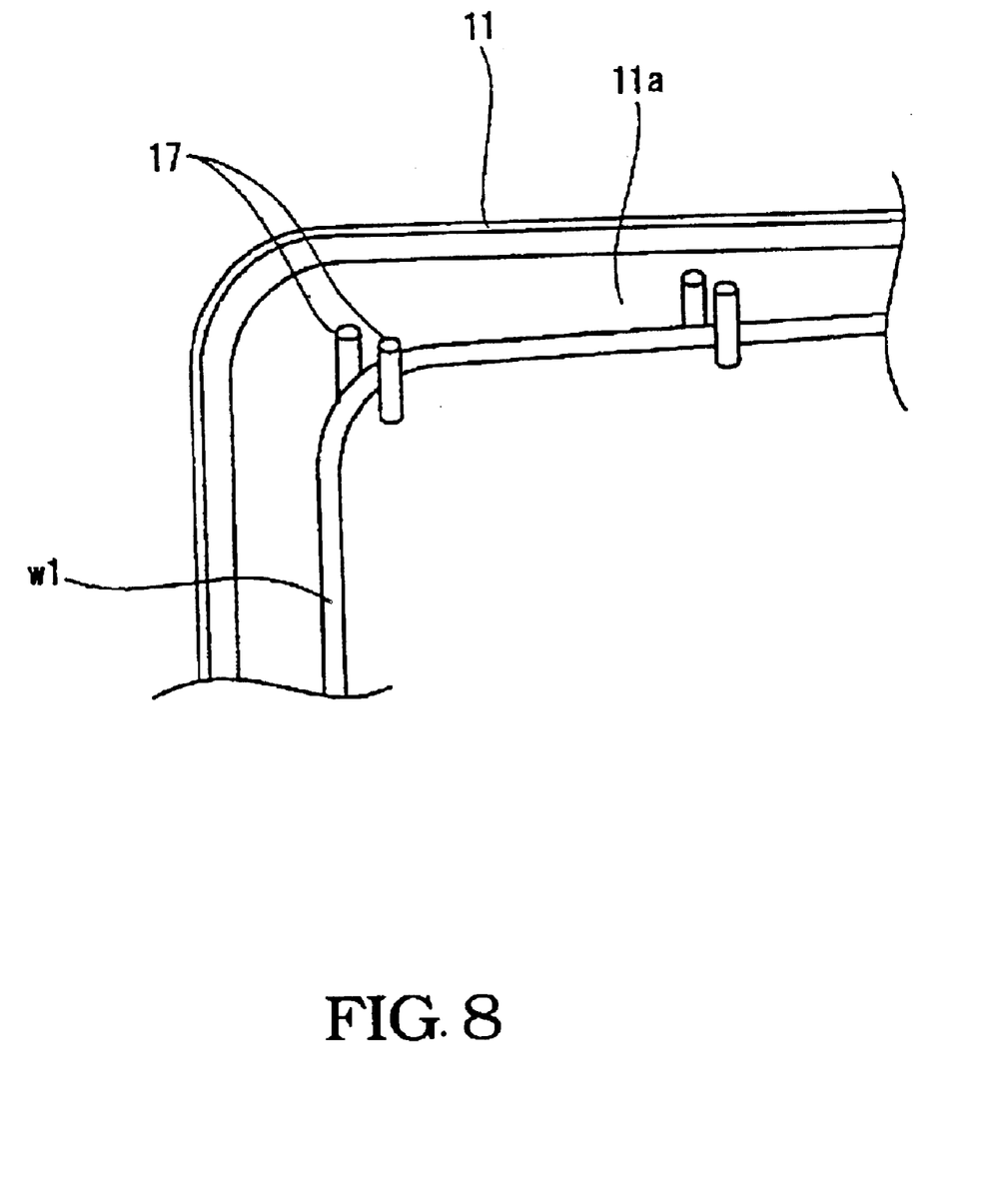
FIG. 8 is a perspective view of wire guides of the present invention with a wire guided thereby.

FIG. 7B illustrates a second embodiment of the vertical busbar in which beam-shaped vertical busbar 19 is installed on case underside 11a and connected to fuse receptacle 12 through connector pieces 30. Grip slot 30a at the lower end of each connector piece 30 connects to the vertical busbar 19 while the fuse (not shown in the figure) within fuse receptacle 12 connects to grip slot 30b at the upper end of each connector piece 30.

It is noted that the foregoing examples have been provided merely for the purpose of explanation and are in no way to be construed as limiting of the present invention. While the present invention has been described with reference to certain embodiments, it is understood that the words which have been used herein are words of description and illustration, rather than words of limitation. Changes may be made, within the purview of the appended claims, as presently stated and as amended, without departing from the scope and spirit of the present invention in its aspects. Although the present invention has been described herein with reference to particular means, materials and embodiments, the present invention is not intended to be limited to the particulars disclosed herein; rather, the present invention extends to all functionally equivalent structures, methods and uses, such as are within the scope of the appended claims.

The present application claims priority under 35 U.S.C. §119 of Japanese Patent Application No. 2002-066442, filed on Mar. 12, 2002, the disclosure of which is expressly incorporated by reference herein in its entirety.

What is claimed is:

1. An electrical connector box having at least one of a relay, a fuse and a connector, the connector box comprising:

a connector box case configured to guide a wire held between a plurality of pairs of spaced-apart wire guides along a side of said case;

a relay terminal having pinch blades on one end thereof, said pinch blades having a slot therebetween and configured to hold the wire in said slot; and one of a female and male terminal on the other end of said relay terminal, said one of a female and male terminal configured to connect to a terminal of the at least one of a relay, a fuse and a connector wherein:

said slot is configured to be welded closed by applying a welded portion to said pinch blades.

2. The electrical connector box according to claim 1, wherein said case further comprises a holding cavity configured to selectively hold one of said relay terminal and a terminal connected to a wire end.

3. The electrical connector box according to claim 1, wherein
the electrical connector box is a relay block.

4. The electrical connector box according to claim 3, further comprising a busbar configured to conduct a first electrical current, wherein the wire is configured to conduct a second electrical current weaker than the first electrical current.

5. The electrical connector box according to claim 3, wherein said side of said case is an underside.

6. The electrical connector box according to claim 3, wherein said case further comprises a holding cavity configured to selectively hold one of said relay terminal and a terminal connected to a wire end.

7. The electrical connector box according to claim 1, wherein each end of the wire is respectively connected to pinch blades of respective relay terminals.

8. The electrical connector box according to claim 7, wherein said case further comprises a holding cavity configured to selectively hold one of said relay terminal and a terminal connected to a wire end.

9. The electrical connector box according to claim 1, wherein the other end of said relay terminal is a female terminal configured to join the terminal of the at least one of a relay, a fuse and a connector.

10. The electrical connector box according to claim 9, wherein said case further comprises a holding cavity configured to selectively hold one of said relay terminal and a terminal connected to a wire end.

11. The electrical connector box according to claim 1, wherein the other end of said relay terminal is a male terminal configured to join a female terminal of a connector.

12. The electrical connector box according to claim 11, wherein said case further comprises a holding cavity configured to selectively hold one of said relay terminal and a terminal connected to a wire end.

13. A method for routing an electrical wire along a surface of an electrical connector box, comprising:

guiding the wire along the electrical connector box via a plurality of pairs of spaced-apart wire guides on the electrical connector box;

holding the wire in a slot located between pinch blades on an end of a relay terminal;

connecting one of a female and male terminal provided on the other end of the relay terminal to a terminal of at least one of a relay, a fuse and a connector; and welding the slot closed by applying a welded portion to said pinch blades.

14. The method according to claim 13, further comprising selectively holding, in a holding cavity, one of the relay terminal and a terminal connected to a wire end.

15. The method according to claim 13, wherein:

the electrical connector box is a relay block; and said connecting includes connecting a female terminal of the relay terminal to the terminal of the at least one of a relay, a fuse and a connector.

16. The method according to claim 15, further comprising:

conducting a first electrical current through a busbar; and conducting a second electrical current weaker than the first electrical current, through the wire.

17. A method for routing an electrical wire along a surface of an electrical connector box, comprising:

guiding the wire along the electrical connector box via a plurality of pairs of spaced-apart wire guides on the electrical connector box;

holding the wire in a slot located between pinch blades on an end of a relay terminal;

connecting one of a female and male terminal provided on the other end of the relay terminal to a terminal of at least one of a relay, a fuse and a connector; and welding the wire to the pinch blades to close the slot, by applying a welded portion to said pinch blades.

18. The method according to claim 17, further comprising selectively holding, in a holding cavity, one of the relay terminal and a terminal connected to a wire end.

19. The method according to claim 17, wherein:

the electrical connector box is a relay block; and said connecting includes connecting a female terminal of the relay terminal to the terminal of the at least one of a relay, a fuse and a connector.

20. The method according to claim 19, further comprising:

conducting a first electrical current through a busbar; and conducting a second electrical current weaker than the first electrical current, through the wire.

* * * * *